(12) United States Patent
Chang

(10) Patent No.: US 11,464,111 B2
(45) Date of Patent: Oct. 4, 2022

(54) STACKED STRUCTURE OF CIRCUIT BOARDS

(71) Applicant: INNODISK CORPORATION, New Taipei (TW)

(72) Inventor: Shuang-Te Chang, New Taipei (TW)

(73) Assignee: INNODISK CORPORATION, New Taipei (TW)

( * ) Notice: Subject to any disclaimer, the term of this patent is extended or adjusted under 35 U.S.C. 154(b) by 240 days.

(21) Appl. No.: 16/843,211

(22) Filed: Apr. 8, 2020

(65) Prior Publication Data
US 2021/0195745 A1 Jun. 24, 2021

(30) Foreign Application Priority Data

Dec. 20, 2019 (TW) .................................. 108146957

(51) Int. Cl.
| | |
|---|---|
| *H05K 1/14* | (2006.01) |
| *H05K 1/18* | (2006.01) |
| *H05K 3/36* | (2006.01) |
| *H01R 13/66* | (2006.01) |
| *H05K 5/02* | (2006.01) |
| *G06F 1/00* | (2006.01) |
| *H05K 9/00* | (2006.01) |

(52) U.S. Cl.
CPC .............. *H05K 1/144* (2013.01); *G06F 1/00* (2013.01); *H01R 13/6658* (2013.01); *H05K 1/182* (2013.01); *H05K 3/368* (2013.01); *H05K 5/0278* (2013.01); *H05K 9/0022* (2013.01); *H05K 2201/042* (2013.01); *H05K 2201/10189* (2013.01)

(58) Field of Classification Search
CPC ....................................................... H05K 1/144
See application file for complete search history.

(56) References Cited

U.S. PATENT DOCUMENTS

| | | | | |
|---|---|---|---|---|
| 2006/0238991 | A1* | 10/2006 | Drako ..................... | G06F 1/185 |
| | | | | 361/796 |
| 2015/0363109 | A1* | 12/2015 | Frick ..................... | G06F 3/0659 |
| | | | | 711/112 |
| 2017/0220505 | A1* | 8/2017 | Breakstone ......... | G06F 13/4282 |

* cited by examiner

*Primary Examiner* — Mukundbhai G Patel
(74) *Attorney, Agent, or Firm* — Allen, Dyer, Doppelt + Gilchrist, PA

(57) ABSTRACT

The invention provides a stacked structure of circuit boards applied to a data storage device. The stacked structure comprises a main circuit board and a slave circuit board. The main circuit board comprises a controller, a plurality of flash memories, a first connector, and a first transmission interface. The slave circuit board comprises an operation management chip, a second connector, and a second transmission interface. The operation management chip comprises a microprocessor and a network communication element. The slave circuit board is stacked on the main circuit board, and connected to the first connector of the main circuit board via the second connector. When the slave circuit board receives a specific operation instruction, the microprocessor of the slave circuit board will transmit the specific operation instruction to the electronic apparatus via the second transmission interface, the electronic apparatus executes a corresponding operation according to the specific operation instruction.

9 Claims, 9 Drawing Sheets

STACKED STRUCTURE OF CIRCUIT BOARDS

This non-provisional application claims priority claim under 35 U.S.C. § 119(a) on Taiwan Patent Application No. 108146957 filed Dec. 20, 2019, the entire contents of which are incorporated herein by reference.

FIELD OF THE INVENTION

The present invention relates to a stack structure of circuit boards, particularly to a stack structure of circuit boards applied to a data storage device.

BACKGROUND

SSD is often made of a circuit board in M.2 form. M.2 is a transmission interface of a new standard protocol established by PCI-SIG and SATA-IO associations. M.2, originally known as the NGFF (Next Generation Form Factor), is now called M.2. M.2 interface can support the standard protocols of SATA, USB and PCIe, has a variety of dimensions and the advantage of fast transmission speed, and can be applied to various kinds of expansion cards like the solid state disk (SSD), WIFI, Bluetooth and near field communication (NFC), etc.

Currently, the circuit board in M.2 form applied in SSD field is developed with various specifications like 22 mm (width)×30 mm (length), 22 mm×42 mm, 22 mm×60 mm, 22 mm×80 mm and 22 mm×110 mm. A longer form factor of circuit board in N.2 form (such as 22 mm×80 mm or 22 mm×110 mm) is having a larger reserved space that is able to be equipped with more electronic elements (such as flash memories, Bluetooth chip, NFC chip) so as to obtain a higher data storage capacity or expand more functions.

The current electronic product is designed towards the characteristics of light, thin, short, and small. The ultra-slim compact electronic product is usually unable to provide enough space to accommodate a large length of circuit board, and therefore only select to use a short length of circuit board, such that the data storage capacity or the expansion of functions of the electronic product cannot be effectively improved.

SUMMARY

It is one objective of the present invention to provide a data storage device, in which the data storage device comprises a master circuit board and a slave circuit board. The master circuit board is used for storing data, and the slave circuit board is used for monitoring and controlling an operation of an electronic apparatus. The slave circuit board is stacked on the master circuit board. The data storage device can be expanded the function for monitoring and controlling the operation of the electronic apparatus via the configuration of the slave circuit board. The master circuit board and the slave circuit board can be made of the small form factor of circuit boards because the master circuit board and the slave circuit board of the data storage device are combined into a stacked structure, and thereby the volume of the data storage device can be effectively reduced, and the data storage device with the smaller volume can be smoothly placed in an interior of the electronic device.

To achieve the above objective, the present invention provides a stacked structure of circuit boards, which can be applied to a data storage device, the stacked structure comprising: a master circuit board comprising a plurality of flash memories, a first transmission interface, a first connector, and a controller connected to the plurality of flash memories, the first transmission interface, and the first connector; and a slave circuit board comprising an operation management chip, a second transmission interface, and a second connector, wherein the operation management chip comprises a microprocessor and a network communication component, the microprocessor is connected to the network communication component, the second transmission interface, and the second connector; the slave circuit board is stacked on the master circuit board, and connected to the first connector of the master circuit board via the second connector; the data storage device is connected to an electronic apparatus via the second transmission interface of the slave circuit board; wherein, when the operation management chip receives a specific operation instruction via the network communication component, the microprocessor of the operation management chip transmits the specific operation instruction to the electronic apparatus via the second transmission interface, and then the electronic apparatus executes a corresponding operation according to the specific operation instruction.

In one embodiment of the present invention, the first transmission interface is a golden finger interface conforming to a M.2 transmission specification, or a connector conforming to a SATA, OCulink, or USB transmission specification.

In one embodiment of the present invention, the second transmission interface is a transmission interface conforming to an industrial communication transmission specification, an Ethernet communication transmission specification, or an input and output transmission specification.

In one embodiment of the present invention, the second transmission interface is a transmission interface of serial bus, CAN bus, PoE, or GPIO.

In one embodiment of the present invention, the microprocessor is connected to a cloud management platform via the network communication component, and the specific operation instruction is sent from the cloud management platform.

In one embodiment of the present invention, the slave circuit board is connected to the electronic apparatus via the second transmission interface, the electronic apparatus comprises an operation component, the operation component is a reset switch, the operation instruction sent from the cloud management platform is a reset operation instruction; the operation management chip transmits the reset operation instruction to the operation component of the electronic apparatus via the second transmission interface after receiving the reset operation instruction, the operation component executes a reboot operation to the electronic apparatus.

In one embodiment of the present invention, the slave circuit board is connected to the electronic apparatus via the second transmission interface, the electronic apparatus comprises an operation component, the operation component is a reset switch, the operation component is an electronic component for measuring and collecting at least one operation parameter, the operation instruction sent from the cloud management platform is an operation instruction for collecting the at least one operation parameter; the operation management chip transmits the operation instruction for collecting the at least one operation parameter to the operation component of the electronic apparatus via the second transmission interface after receiving the operation instruction for collecting the at least one operation parameter, the operation component executes a measurement and collection of the at least one operation parameter generated during a production process of the electronic apparatus to generate a collection message including the at least one operation parameter, and then transmits the collection message to the operation management chip of the data storage device via the second transmission interface; the operation management chip of the data storage device transmits the collection message received from the electronic apparatus to the cloud management platform.

In one embodiment of the present invention, the microprocessor of the operation management chip is configured with an embedded system, and the cloud management platform monitors or controls the operation of the electronic apparatus via the embedded system.

In one embodiment of the present invention, the first connector and the second connector are a Board to Board connector, respectively.

In one embodiment of the present invention, the network communication component is a WiFi communication component, an Ethernet communication component, or a 3G, 4G or 5G communication component.

DETAILED DESCRIPTION OF THE PREFERRED EMBODIMENTS

Figures 1A, 1B:
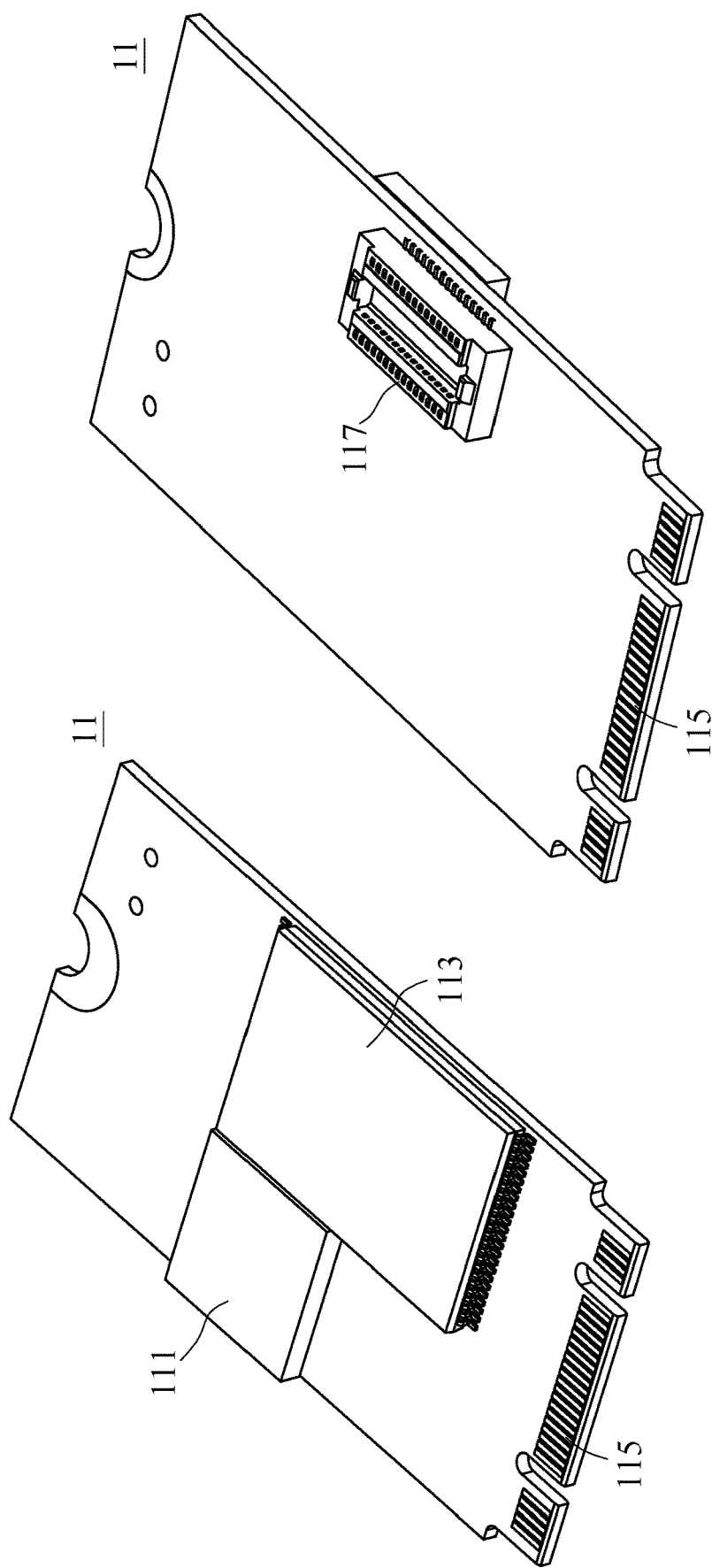
FIG. 1A is a stereoscopic diagram in a first viewing angle of a master circuit board according to one embodiment of a data storage device of the present invention.
FIG. 1B is a stereoscopic diagram in a second viewing angle of the master circuit board according to one embodiment of the data storage device of the present invention.
Figure 2B:
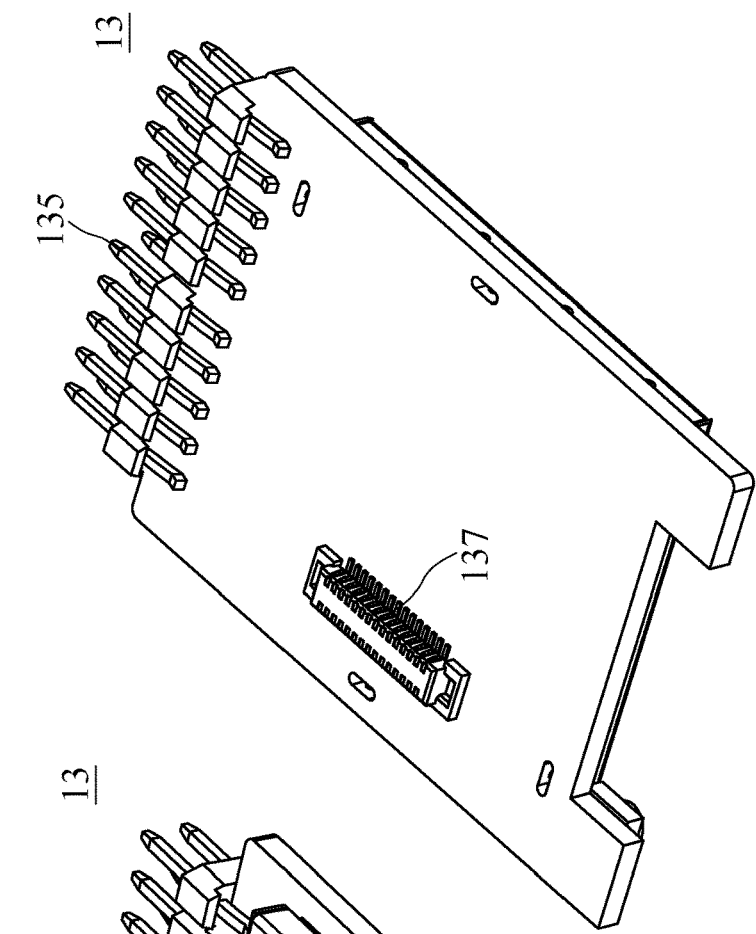
FIG. 2B is a stereoscopic diagram in a second viewing angle of the slave circuit board according to one embodiment of the data storage device of the present invention.
Figure 2A:
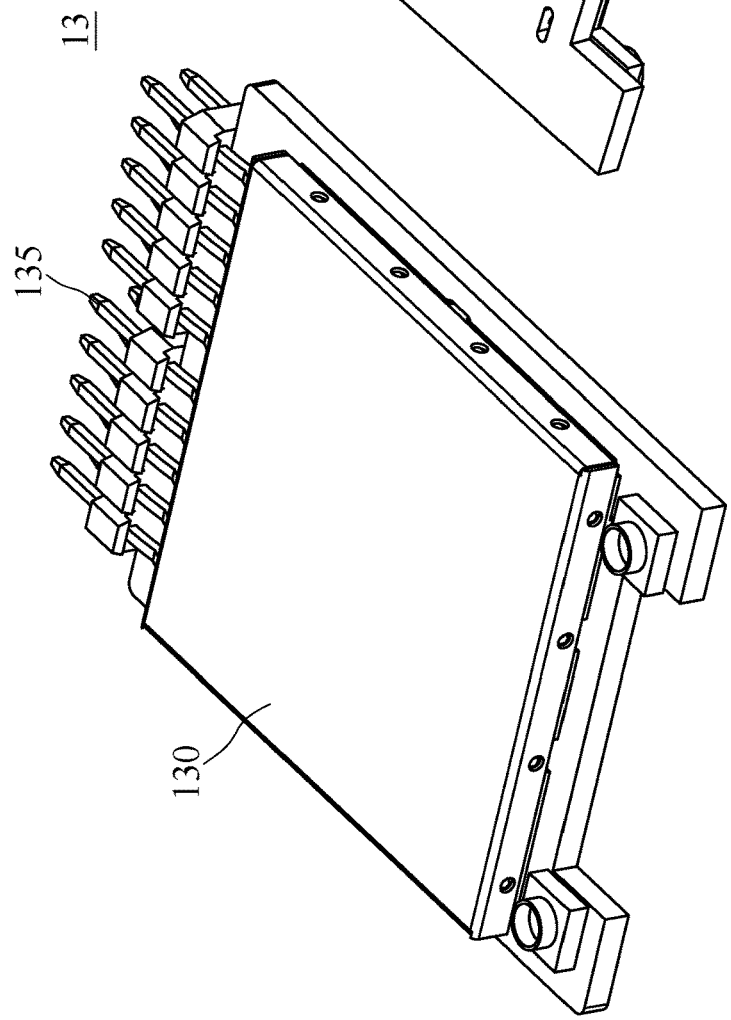
FIG. 2A is a stereoscopic diagram in a first viewing angle of a slave circuit board according to one embodiment of the data storage device of the present invention.
Figure 3:
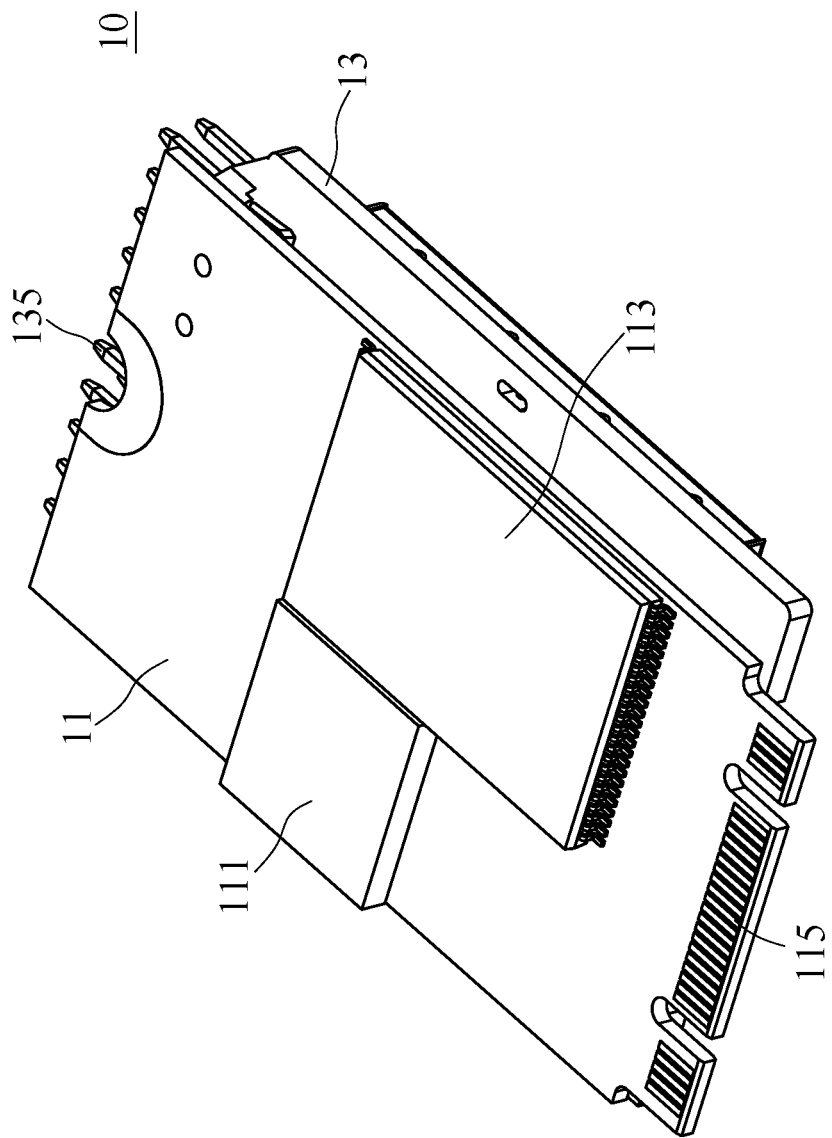
FIG. 3 a stereoscopic diagram in a first viewing angle of a stacked structure formed by the master circuit board and the slave circuit board according to one embodiment of the data storage device of the present invention.
Figure 4:
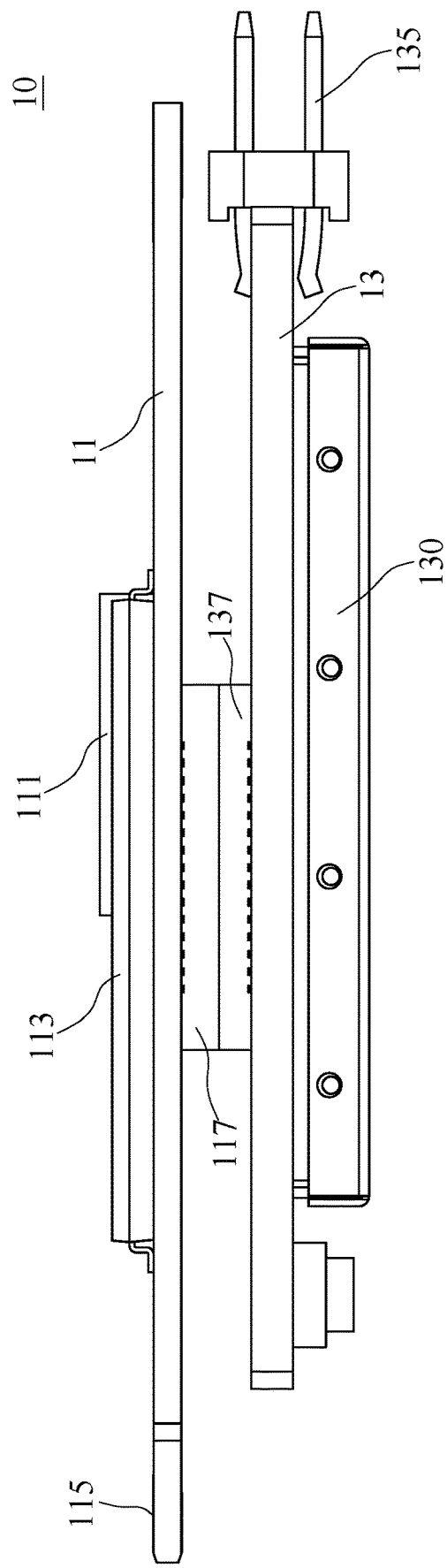
FIG. 4 is a cross-sectional view of the stacked structure formed by the master circuit board and the slave circuit board according to one embodiment of the data storage device of the present invention.

Referring to FIG. 1A and FIG. 1B, there are shown stereoscopic diagrams in a first viewing angle and in a second viewing angle of a master circuit board according to one embodiment of a data storage device of the present invention; referring to FIG. 2A and FIG. 2B, there are shown stereoscopic diagrams in a first viewing angle and in a second viewing angle of a slave circuit board according to one embodiment of the data storage device of the present invention; referring to FIG. 3, there is shown a stereoscopic diagram in a first viewing angle of a stacked structure formed by the master circuit board and the slave circuit board according to one embodiment of the data storage device of the present invention; referring to FIG. 4, there is shown a cross-sectional view of the stacked structure formed by the master circuit board and the slave circuit board according to one embodiment of the data storage device of the present invention. As shown in FIG. 1A, the data storage device 10 comprises a master circuit board 11. The master circuit board 11 comprises a controller 111, a plurality of flash memories 113, and a first transmission interface 115. The first transmission interface 115 is a golden finger interface conforming to a M.2 transmission specification. The data storage device 10 is configured in an electronic apparatus. The data storage device 10 is inserted into a connection seat on a motherboard of the electronic apparatus via the first transmission interface 115, and as a data storage medium of the electronic device. The electronic apparatus reads data from the data storage device 10 or writes data into the data storage device 10 via the first transmission interface 115.

As shown in FIG. 2A, the data storage device 10 further comprises a slave circuit board 13. The slave circuit board 13 comprises an operation management chip 130 and a second transmission interface 135. The operation management chip130 is a chip with a network communication function. The second transmission interface 135 is a control interface in pin form. In one embodiment of the present invention, the second transmission interface 135 is a transmission interface conforming to an industrial communication transmission specification, for example, serial bus (such as RS232, RS482, or RS485) or CAN (Controller Area Network) bus. In other embodiment of the present invention, the second transmission interface 135 is a transmission interface conforming to an Ethernet communication transmission specification, for example, PoE transmission interface. In another embodiment of the present invention, the second transmission interface 135 is a transmission interface conforming to an input and output transmission specification, for example, GPIO (General Purpose Input/Output) transmission interface. When the operation management chip 130 receives a specific operation instruction from a cloud via a network, it will transmit the specific operation instruction to the electronic apparatus based on the transmission interface in RS232, RS482, RS485, CAN, PoE, or GPIO form. Thus, the operation management chip 130 receives the specific operation instruction from the cloud via the network, and transmit the specific operation instruction to the electronic apparatus via the second transmission interface 135 to command that the electronic apparatus executes a corresponding operation according to the specific operation instruction.

As shown in FIG. 1B, FIG. 2B, FIG. 3, and FIG. 4, the master circuit board 11 further comprises a first connector 117, and the slave circuit board 13 further comprises a second connector 137. The slave circuit board 13 is stacked on the master circuit board 11, and electrically connected to the first connector 117 of the master circuit board 11 via the second connector 137. The first connector 117 and the second connector 137 are a Board to Board (BTB) connector, respectively.

The slave circuit board 13 is stacked on the master circuit board 11, so that the data storage device 10 is able to expand a function for monitoring or controlling the operation of the electronic apparatus. The master circuit board 11 and the slave circuit board 13 can be made of the small form factor of circuit boards because the master circuit board 11 and the slave circuit board 13 of the data storage device 10 are combined into a stacked structure, for example, 22 mm×30 mm, 22 mm×42 mm, or 22 mm×60 mm circuit boards, in such a way that the volume of the data storage device 10 can be effectively reduced, and therefore the data storage device 10 with the smaller volume can be smoothly placed in an interior of the electronic device 20.

Figure 5:
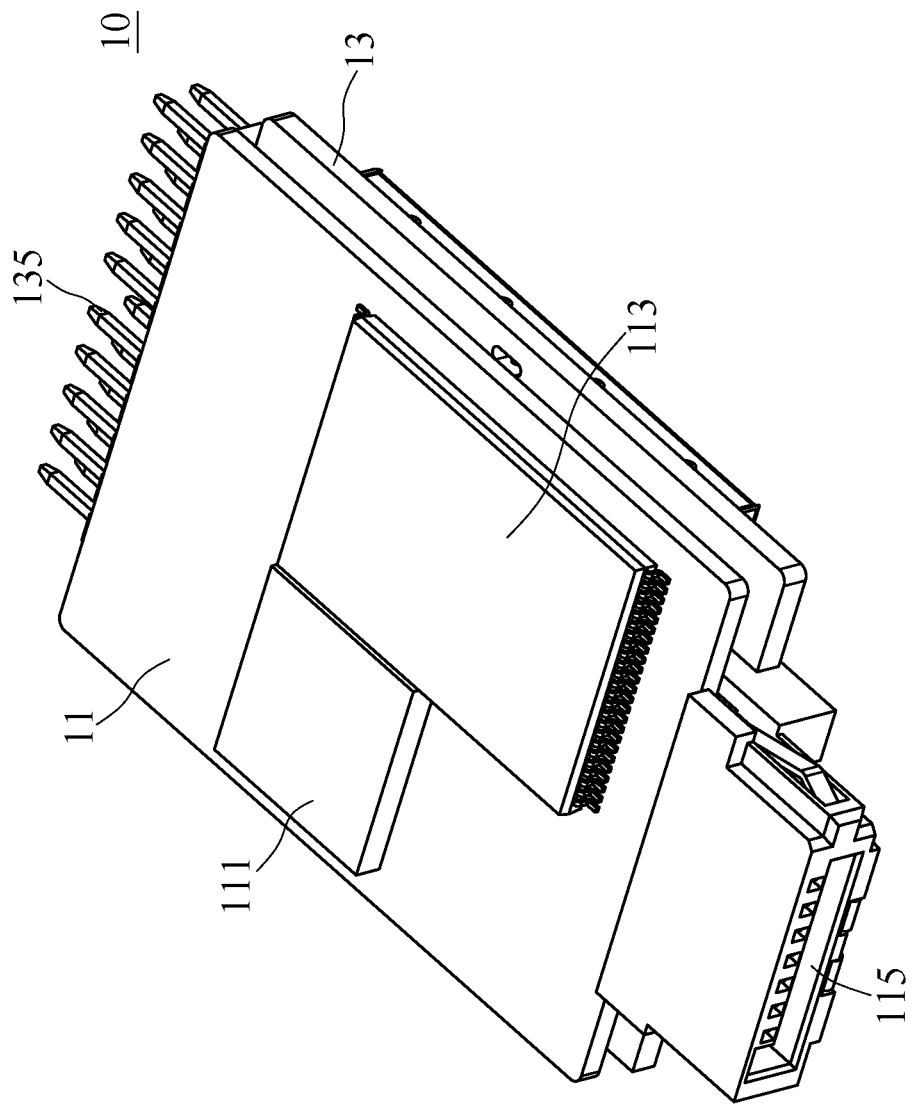
FIG. 5 is a stereoscopic diagram in the first viewing angle of the stacked structure formed by the master circuit board and the slave circuit board according to another embodiment of the data storage device of the present invention.
Figure 6:
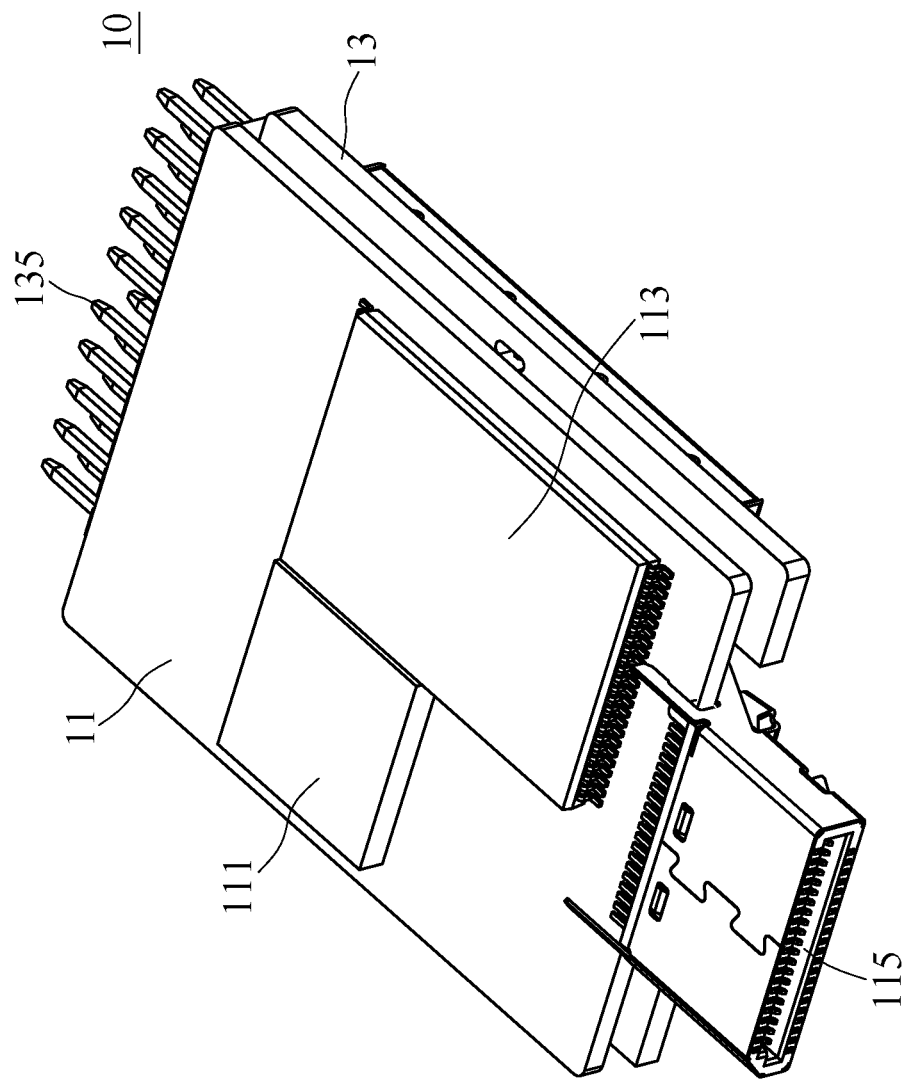
FIG. 6 is a stereoscopic diagram in the first viewing angle of the stacked structure formed by the master circuit board and the slave circuit board according to another embodiment of the data storage device of the present invention.

In one embodiment of the present invention, the first transmission interface 115 is a golden finger interface conforming to M.2 transmission specification, as shown in FIG. 3. In other embodiment of the present invention, the first transmission interface 115 is a connector conforming to SATA transmission specification, as shown in FIG. 5. In another embodiment of the present invention, the first transmission interface 115 is a connector conforming to OCulink or USB transmission specification, as shown in FIG. 6.

Figure 7:
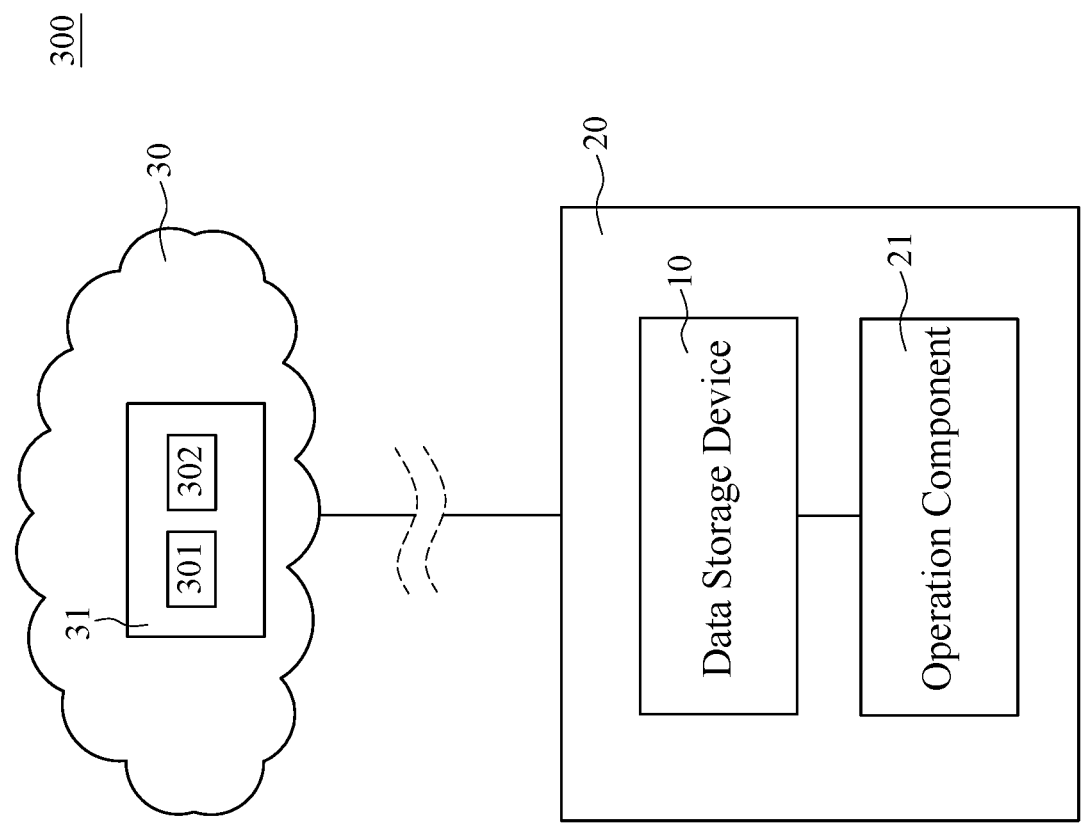
FIG. 7 is an architecture diagram of a system capable of remotely controlling an operation of an electronic apparatus according to one embodiment of the present invention.
Figure 8:
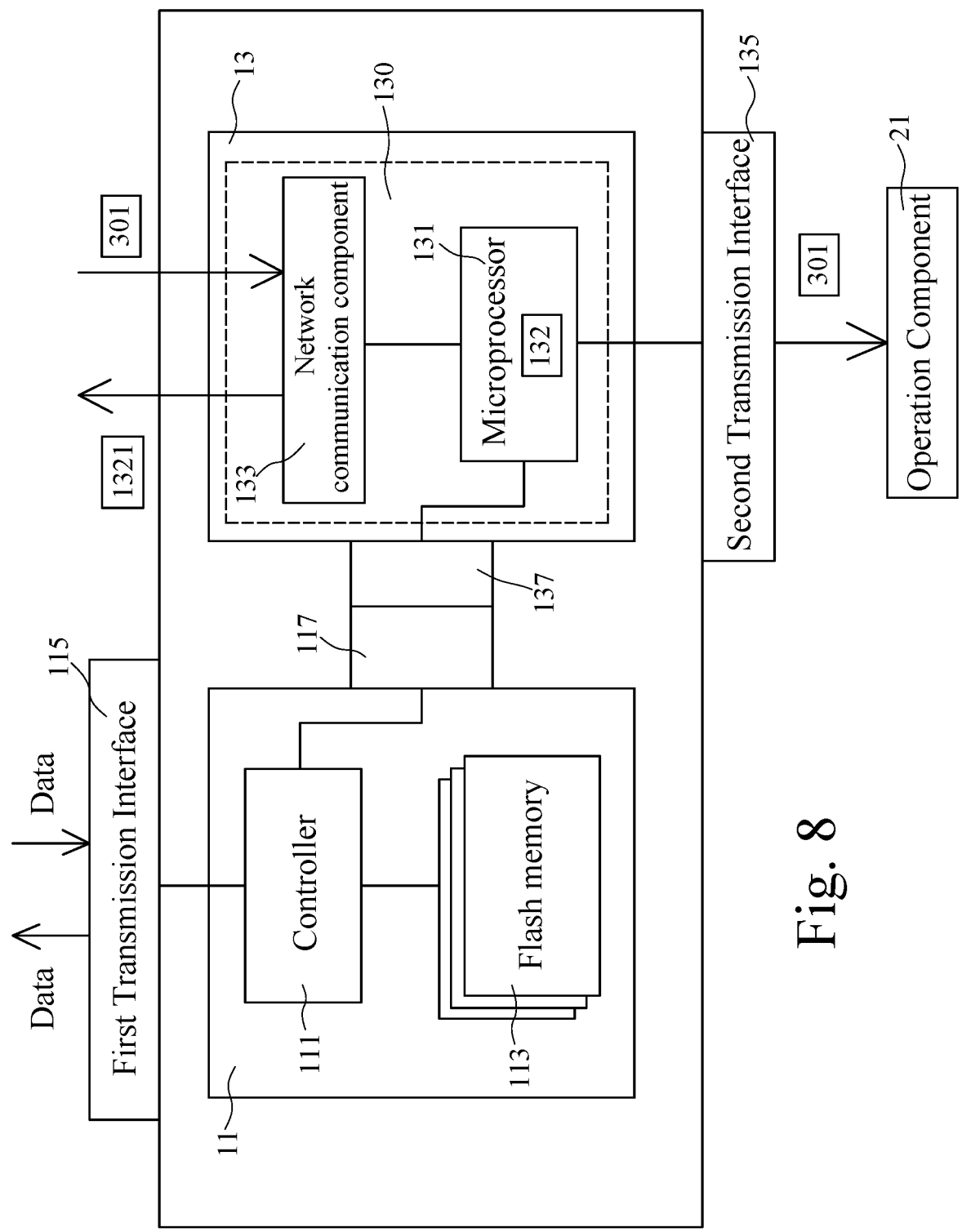
FIG. 8 is a circuit diagram of the data storage device according to one embodiment of the present invention.

Referring to FIG. 7 and FIG. 8, there are shown an architecture diagram of a system capable of remotely controlling an operation of an electronic apparatus according to one embodiment of the present invention, and a circuit diagram of the data storage device according to one application embodiment of the present invention. As shown in FIG. 7 and FIG. 8, the system 300 comprises an electronic apparatus 20 and a cloud management platform 30. The cloud management platform 30 is capable of controlling the electronic apparatus 20, remotely. The electronic apparatus 20 may also be a computer device, a microcomputer device, a tool machine, a production device, or an intelligent device. The data storage device 10 is configured in the inside of the electronic apparatus 20. The controller 11 is electrically connected to the flash memories 113, the first transmission interface 115, and the first connector 117. The electronic apparatus 20 reads data that is required for the operation from the flash memories 113 of the data storage device 10 via the first transmission interface 115, or writes data generated during the operation to the flash memories 113 of the data storage device 10 via the first transmission interface 115.

The operation management chip 130 comprises a microprocessor 131 and a network communication component 133. The microprocessor 131 is connected to the network communication component 133, the second transmission interface 135, and the second connector 137. In one embodiment of the present invention, the microprocessor 131 and the network communication component 133 are integrated into a single chip, for example, the operation management chip 130. In other embodiment of the present invention, the microprocessor 131 and the network communication element 133 are independent chips, respectively.

The data storage device 10 is connected to the cloud management platform 30 via the network communication component 133. The network communication component 133 is a WiFi communication component, an Ethernet communication component, a 3G, 4G or 5G communication component, or other networkable communication component. The microprocessor 131 is configured with an embedded system 132 that is an architecture system of Linux or RTOS (such as TinyOS). The manager of the cloud management platform 30 can monitor or control the operation of the electronic apparatus 20 via the embedded system 132 of the microprocessor 131.

The electronic apparatus 20 comprises at least one operation component 21. The data storage device 10 is electrically connected to the operation component 21 via a combination of the second transmission interface 12 and a connection port on the motherboard of the electronic apparatus 20. When the manager of the cloud management platform 30 wants the electronic apparatus 20 to execute a specific operation, he will send a specific operation instruction 301 or 302 to the electronic apparatus 20 by a management interface 31. The management interface 31 may be an application programming interface in WEB form (WEB App). The microprocessor 131 of the operation management chip 130 transmits the specific operation instruction 301 or 302 to the operation component 21 via the second transmission interface 12 after receiving the specific operation instruction 301 or 302 sent from the cloud management platform 30, and then the operation component 21 executes a corresponding operation according to the specific operation instruction 301 or 302.

Taking an application embodiment to explain, the electronic apparatus 20 is a computer device, the operation component 21 is a reset switch on the motherboard of the electronic apparatus 20. As shown in FIG. 7 and FIG. 8, when the embedded system 132 of the operation management chip 130 of the data storage device 10 monitors that the electronic apparatus 20 has crashed, it will actively report a crash message 1321 to the cloud management platform 30. After the manager of the cloud management platform 30 receives the crash message 1321, he will transmit a reset operation instruction 301 to the data storage device 10 of the electronic apparatus 20 via the management interface 31. The operation management chip 130 of the data storage device 10 transmits the reset operation instruction 301 to the operation component 21 of the electronic apparatus 20 via the second transmission interface 135 after receiving the reset operation instruction 301. The operation component (such as the reset switch) 21 executes a reboot operation for the electronic apparatus 20, such that the electronic apparatus 20 can resume normal operation.

Figure 9:
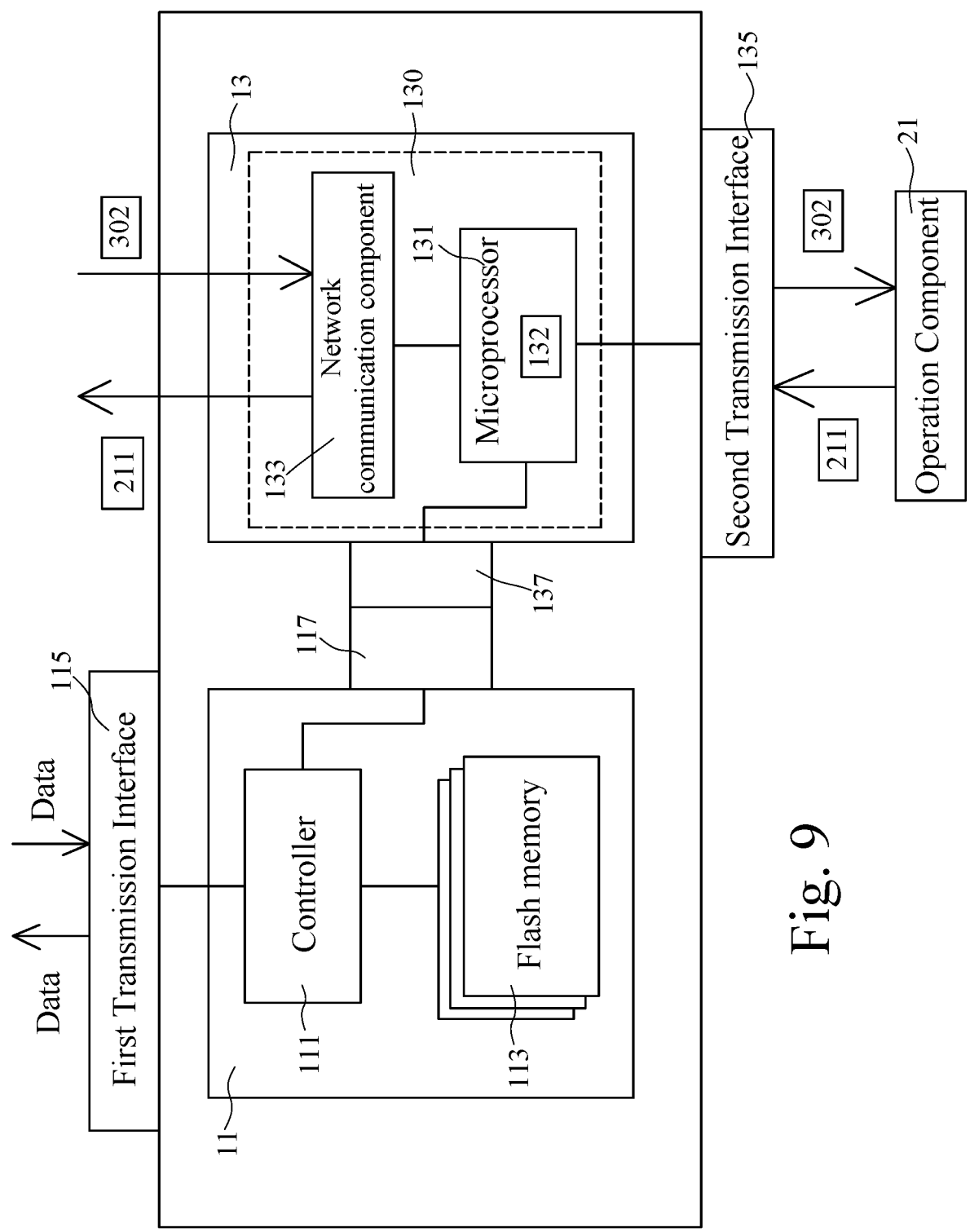
FIG. 9 is a circuit diagram of the data storage device according to another embodiment of the present invention.

Taking another application embodiment to explain, the electronic apparatus 20 is a production apparatus, the operation component 21 is an electronic component for measuring and collecting at least one operation parameter, for example, temperature, current, vibration, displacement, or angle, etc. As shown in FIG. 8 and FIG. 9, when the manager of the cloud management platform 30 wants to monitor a production process of the electronic apparatus 20, he will send an operation instruction 302 for collecting the operation parameter to the data storage device 10 of the electronic apparatus 20 via the management interface 31. The embedded system 132 of the operation management chip 130 of the data storage device 10 transmits the operation instruction 302 to the operation component 21 via the second transmission interface 12 after receiving the operation instruction 302. The operation component 21 executes a measurement and collection of the operation parameter generated during the production process of the electronic apparatus 20 according to the operation instruction 302 to generate a collection message 211 including the operation parameter, and then transmits the collection message 211 to the operation management chip 130 of the data storage device 10 via the second transmission interface 135. The embedded system 132 of the operation management chip 130 of the data storage device 10 transmits the collection message 211 received from the electronic apparatus 20 to the cloud management platform 30. The cloud management 30 analyzes the operation parameter in the collection message 211 to determine whether the operation parameter generated during the production process of the electronic apparatus 20 is within a permissible scope. If the manager of the cloud management platform 30 acknowledges that the operation parameter generated during the production process of the electronic apparatus 20 has exceeded the permissible scope from the analysis of the operation parameter, he will notify a worker of the electronic apparatus 20 to check and adjust at least one workpiece of the electronic apparatus 20. Accordingly, the manager of the cloud management platform 30 can monitor the production status of the electronic apparatus 20 via the embedded system 132 of the operation management chip 130 of the data storage device 10, and ask the worker to timely check and adjust the workpiece of the electronic apparatus 20 when the operation parameter has exceeded the permissible scope, so as to prevent the workpiece of the electronic apparatus 20 from being damaged during the production process, which further affects the accuracy of the produced products.

Besides, the two embodiments in the above described are only some implementations of the present invention. In actual application, the cloud management platform 30 sends a variety of different types of operation instructions to the data storage device 10 of the electronic apparatus 20 according to the operation type of the electronic apparatus 20, or according to the requested monitoring of the operation environment of the electronic apparatus 20, such that the electronic apparatus 20 can execute the corresponding operation according to the request and command of the operation instruction.

Summing the above description, the data storage device 10 of the present invention can be used not only to access a general data, but also used by the remote manager to control the operation of the electronic apparatus 20. Besides, the master circuit board 11 and the slave circuit board 13 of the data storage device 10 are combined into the stacked structure, which can effectively reduce the volume of the data storage device 10, and allow the data storage device 10 with the small volume to be placed in the interior of the electronic device 20.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

What is claimed is:

1. An electronic apparatus comprising:
   an operation component configured to measure and collect at least one operation parameter within the electronic apparatus according to a specific operation instruction;
   a data storage device coupled to the operation component and comprising a stacked structure including:
   a master circuit board comprising a plurality of flash memories, a first transmission interface, a first connector, and a controller connected to the plurality of flash memories, the first transmission interface, and the first connector; and
   a slave circuit board comprising an operation management chip, a second transmission interface, and a second connector, wherein the operation management chip comprises a microprocessor and a network communication component; the microprocessor is connected to the network communication component, the second transmission interface, and the second connector; the slave circuit board is stacked on the master circuit board, and connected to the first connector of the master circuit board via the second connector; and
   the data storage device is connected to the operation component via the second transmission interface of the slave circuit board and configured to perform the following:
   transmit the specific operation instruction from the microprocessor to the operation component via the second transmission, interface when the operation management chip receives the specific operation instruction via the network communication component, with the specific operation instruction being sent from a cloud management platform; and
   the operation component is configured to perform the following:
   execute a corresponding operation according to the specific operation instruction;
   execute a measurement and collection of the at least one operation parameter according to the operation instruction to generate a collection message including the at least one operation parameter;
   transmit the collection message to the cloud management platform by the operation management chip, with the at least one operation parameter in the collection message being analyzed by the cloud management platform to determine whether the operation parameter of the electronic apparatus is within a permissible scope; and
   in response to the operation parameter exceeding the permissible scope, receive a notification by the cloud management platform to check and adjust at least one workpiece of the electronic apparatus.

2. The electronic apparatus according to claim 1, wherein the first transmission interface is a golden finger interface conforming to a M.2 transmission specification, or a connector conforming to a SATA, OCulink, or USB transmission specification.

3. The electronic apparatus according to claim 1, wherein the second transmission interface is a transmission interface conforming to an industrial communication transmission specification, an Ethernet communication transmission specification, or an input and output transmission specification.

4. The electronic apparatus according to claim 3, wherein the second transmission interface is a transmission interface of serial bus, CAN bus, PoE, or GPIO.

5. The electronic apparatus according to claim 1, wherein the microprocessor is connected to a cloud management platform via the network communication component, and the specific operation instruction is sent from the cloud management platform.

6. The electronic apparatus according to claim 5, wherein the slave circuit board is connected to the electronic apparatus via the second transmission interface, the operation component is a reset switch, the operation instruction sent from the cloud management platform is an operation instruction for collecting the at least one operation parameter; the operation management chip transmits the operation instruction for collecting the at least one operation parameter to the operation component via the second transmission interface after receiving the operation instruction for collecting the at least one operation parameter to the operation component executes the measurement and collection of the at least one operation parameter generated during a production process of the electronic apparatus to generate the collection message, and then transmits the collection message to the operation management chip of the data storage device via the second transmission interface; the operation management chip of the data storage device transmits the collection message received from the electronic apparatus to the cloud management platform.

7. The electronic apparatus according to claim 5, wherein the microprocessor of the operation management chip is configured with an embedded system, and the cloud management platform monitors or controls the operation of the electronic apparatus via the embedded system.

8. The electronic apparatus according to claim 1, wherein the first connector and the second connector are a Board to Board connector, respectively.

9. The electronic apparatus according to claim 1, wherein the network communication component is a WiFi communication component, an Ethernet communication component, or a 3G, 4G or 5G communication component.

* * * * *